United States Patent [19]

Sheller

[11] 4,189,635
[45] Feb. 19, 1980

[54] SELF-TEST CIRCUIT APPARATUS

[75] Inventor: Daniel R. Sheller, Cedar Rapids, Iowa

[73] Assignee: Rockwell International Corporation, El Segundo, Calif.

[21] Appl. No.: 871,572

[22] Filed: Jan. 23, 1978

[51] Int. Cl.² ............................................. G06M 3/12
[52] U.S. Cl. .................... 235/92 EC; 235/92 MS; 235/92 EV; 235/92 CA
[58] Field of Search ......... 235/92 CC, 92 CA, 92 FP, 235/92 MS, 92 EC, 92 EV, 92 PE; 73/6, 1 R; 328/44, 48

[56] References Cited
U.S. PATENT DOCUMENTS

| | | | |
|---|---|---|---|
| 3,746,843 | 7/1973 | Wesner | 235/92 R |
| 3,932,738 | 1/1976 | Hauber et al. | 235/92 EC |
| 4,001,553 | 9/1977 | Troutman | 235/92 T |

Primary Examiner—Joseph M. Thesz
Attorney, Agent, or Firm—Bruce C. Lutz; Howard R. Greenberg; H. Frederick Hamann

[57] ABSTRACT

The present invention relates to the method of and apparatus for performing test operations on a primary counter to make sure that it is continually providing correct operational capability. The tests comprise periodically interrupting the operation of the primary counter, forcing it to count to both the maximum and minimum limits and checking to make sure that the limit has been obtained, inserting an intermediate number and checking to be sure that this number can be transferred therethrough and then resetting the primary counter to the count of a backup counter which has been keeping count during the test process. Finally, a comparison is continually provided during normal operation between the backup and the primary counter to make sure that they are tracking with the same counts. Failure of any of the comparisons or tests to be completed in accordance with specified results causes an error signal to be generated as an alarm.

5 Claims, 5 Drawing Figures

SELF-TEST CIRCUIT APPARATUS

THE INVENTION

The present invention pertains generally to electronics and more specifically to a continuously self-checking unit for making sure that a counter used to monitor input count signals is operating in accordance with specified requirements.

In many situations for use of a counter and in particular an up/down counter it is necessary to be alerted if the counter fails to operate properly. One such use of a counter in which it is critical that an alarm provided upon failure of a counter is a use shown in a co-pending application, Ser. No. 871,576, filed on even date herewith which is assigned to the same assignee as the present invention. This referenced application pertains to a reasonableness circuit incorporated in a system for synchronizing oscillators at all the nodes of a network by comparing the difference between a local oscillator at a node with the frequency rate of received data from all other received nodes, adding the counts generated as a result of the comparisons, dividing by an appropriate scaling factor and adjusting the local oscillator towards a value which will minimize the differences. Since failure of the counter will create large errors throughout the system, it is mandatory that such failure of a counter be quickly known so that action can be taken to correct the problem.

In accordance with the above, a self-testing concept was originated and is the subject of this invention. Basically the concept requires a backup counter to be used in connection with the primary counter wherein the backup counter is used continuously to count the same signals as are counted by the primary counter. However, periodically the operation of the primary counter is interrupted and it is supplied with further signals which force it to count to a maximum count, which count is then tested or checked, then it is forced towards a minimum count and this count is tested or checked and finally it is set to an intermediate count to determine if the intermediate count can be passed through the primary counter. If all three tests are positive, the primary counter is loaded with the count of the backup counter and until the next test operation a comparison circuit checks the count of the backup counter and the primary counter and provides an error signal if the comparison is not identical at any time during normal counting operations.

From the above it will be determined that an object of the present invention is to provide an improved self-testing circuit.

Further objects and advantages of the present invention will be apparent from a reading of the specification and appended claims in conjunction with the drawings wherein:

DETAILED DESCRIPTION

Figure 1:
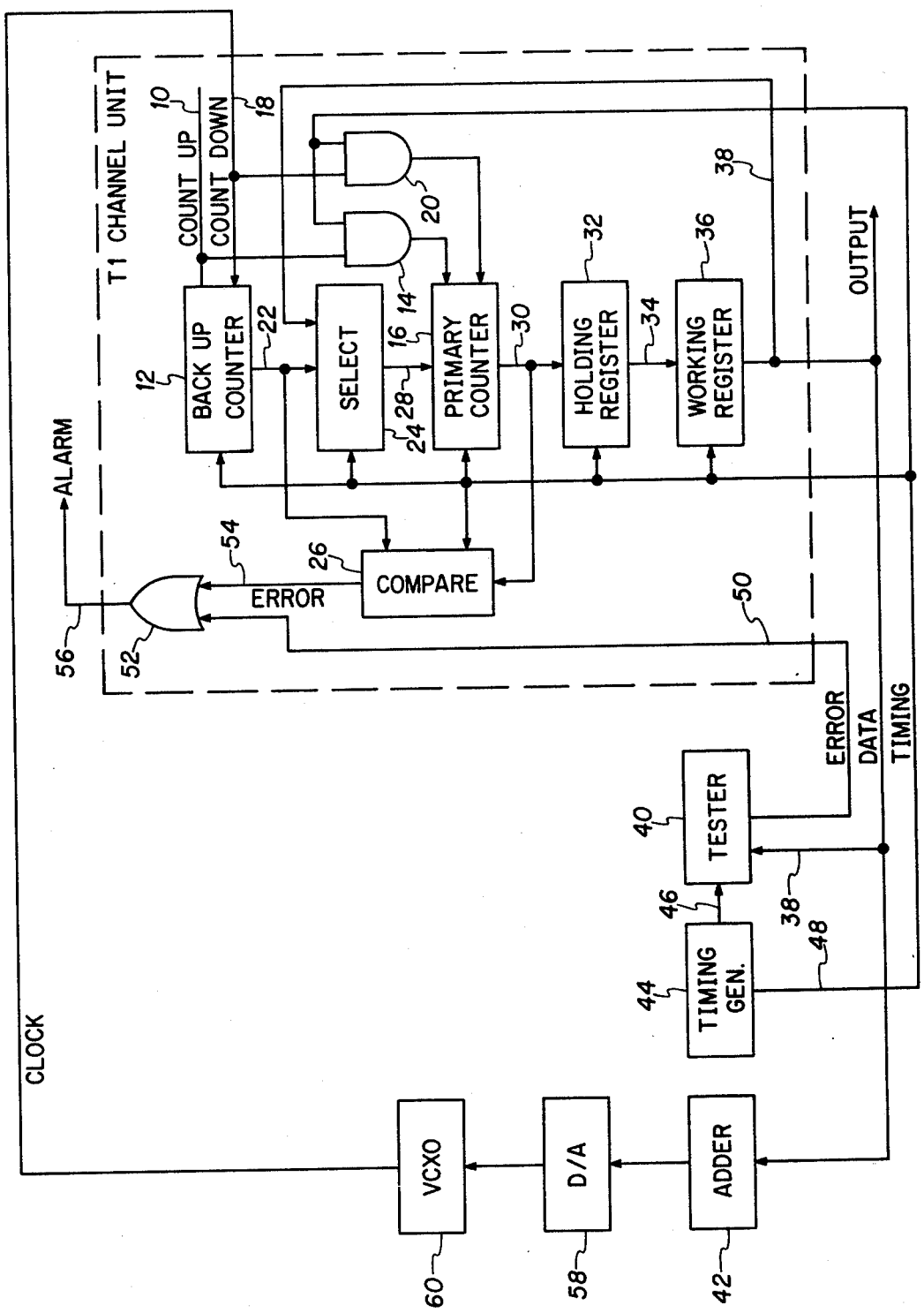
FIG. 1 is a block diagram of one embodiment of the present invention.

Count up signals are supplied on a lead 10 to a backup counter 12 as well as through an AND gate 14 to a primary counter 16. Count down signals are supplied on a lead 18 to backup counter 12 as well as through an AND gate 20 to primary counter 16. An output of backup counter 12 is supplied on a lead 22 to a select block 24 as well as to a compare block 26. Lead 22 as well as many other leads in the subsequent discussion are in actuality a plurality of leads and in this case the plurality of leads provides the count from counter 12 in parallel through select circuit 24 and then on a lead 28 to primary counter 16. This same plurality of leads is applied to the compare circuit 26. Compare circuit 26 also receives a count from primary counter 16 on a set of leads 30. The set of leads 30 is also applied to a holding register 32 which passes signals on a set of leads 34 to a working register 36. An output of working register 36 is supplied on a lead 38 as a further input to select circuit 24 as well as being provided to a tester or test circuit 40 and to an adder 42. Lead 38 is additionally labeled data to illustrate that this is information used in normal operation from the primary counter 16 and an output signal from this apparatus. A timing generator 44 provides timing signals to tester 40 on a lead 46 as well as on a set of leads 48 to each of the blocks 12, 14, 16, 20, 24, 26, 32 and 36 as part of the testing procedure. A lead 50 provides error output signals from tester 40 to an OR gate 52 which also receives error signals on a lead 54 from compare circuit 26. An error appearing on either of leads 50 or 54 will then appear on output lead 56 indicating that there is probably a problem with data obtained from primary counter 16. To complete the disclosure, it will be noted data from adder 42 is passed to a D to A converter 58 which affects the frequency of oscillation of a variable frequency oscillator 60 whose output is used as a signal on lead 18 to the counters 12 and 16.

Figure 2:
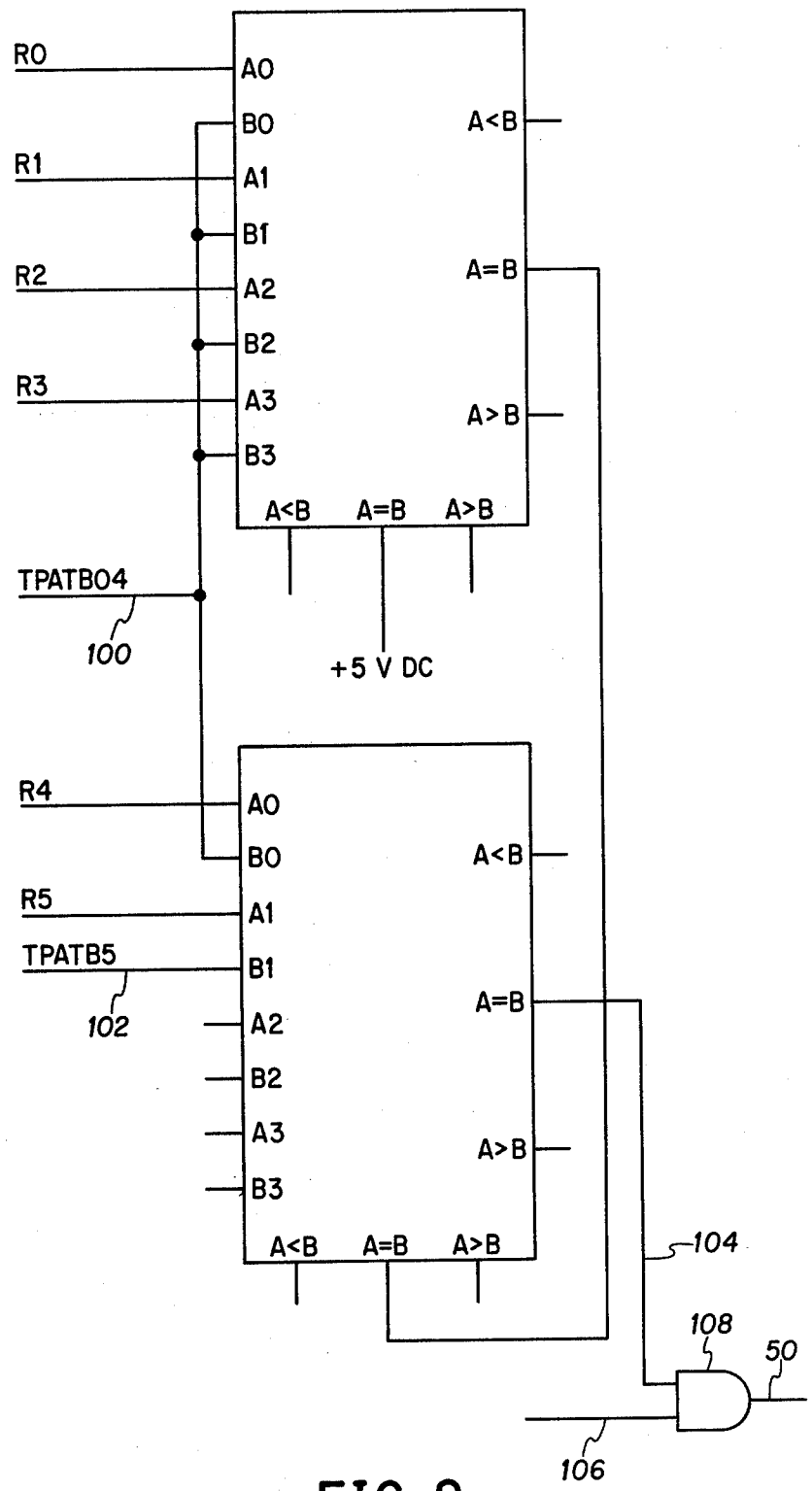
FIGS. 2, 3a, 3b and 3c are detailed schematic diagrams showing the contents of most of the blocks of FIG. 1.

In FIG. 2 the tester circuit 40 comprises a pair of chips, each of which may be comparator chips designated as 74 LS 85 and available from a plurality of semiconductor manufacturing houses. The chips are used to compare input signals obtained from the primary counter on inputs A (data signals R0-R5 from leads 38) against set inputs as provided on inputs B. In one embodiment of the invention the inputs to be determined were a condition of all logic 1's which would indicate a maximum limit or maximum possible count of the primary counter, a condition of all logic 0's, which indicates a condition of minimum count or minimum limit, and finally an intermediate count which was chosen to be a logic 1 followed by all logic 0's. The first two conditions were easy to implement by merely putting all logic 0's or all logic 1's to the B inputs. The third condition is implementable by applying a logic 0 to lead 100 and applying a logic 1 to lead 102. If the appropriate numbers being tested are obtained, an output is provided on lead 104 and if the device is in the test condition, a logic 1 will appear also on lead 106 so as to pass the signal on lead 104 through an AND gate 108 to an output lead shown as 50 in FIG. 1.

Figure 3A:
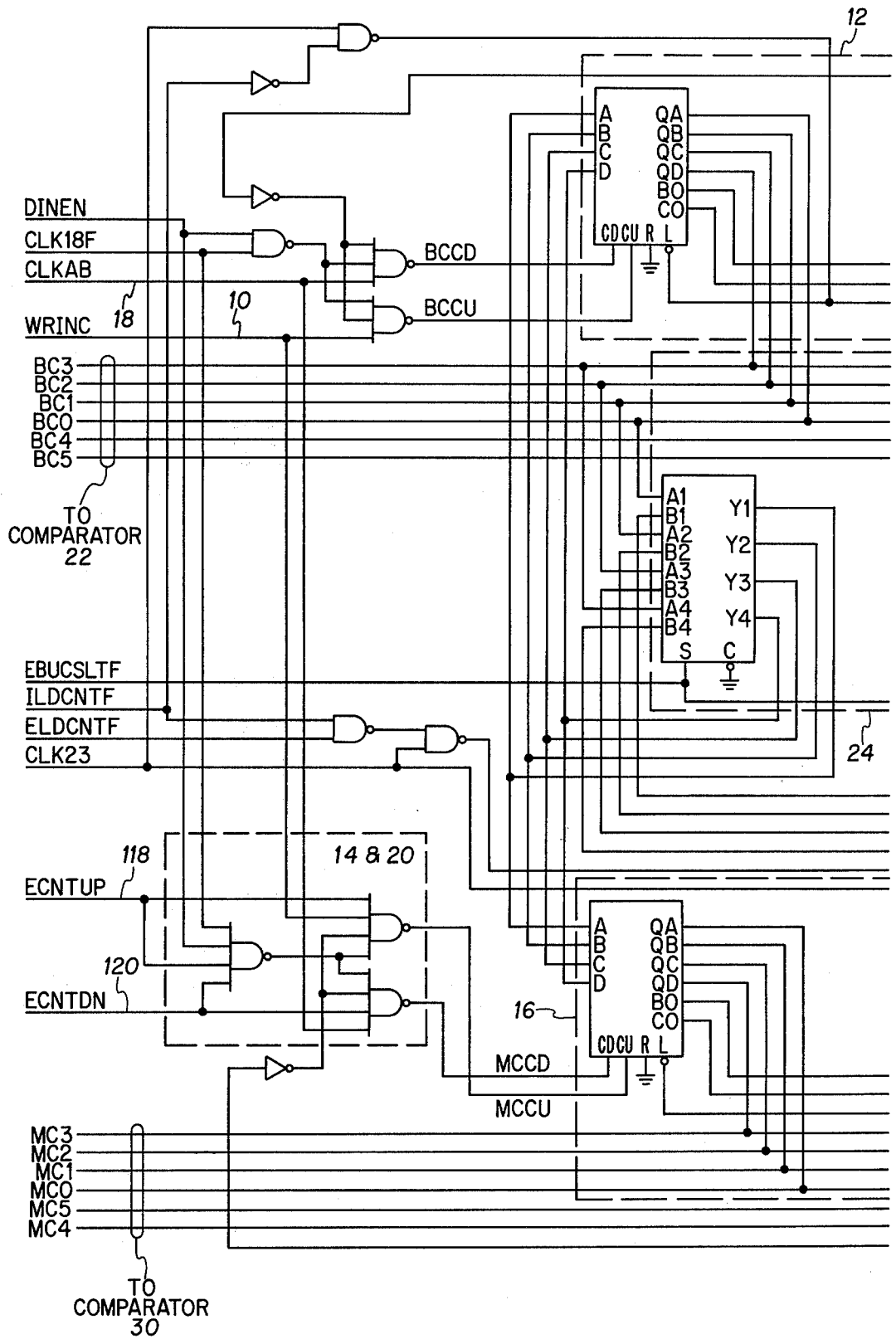
Figure 3B:
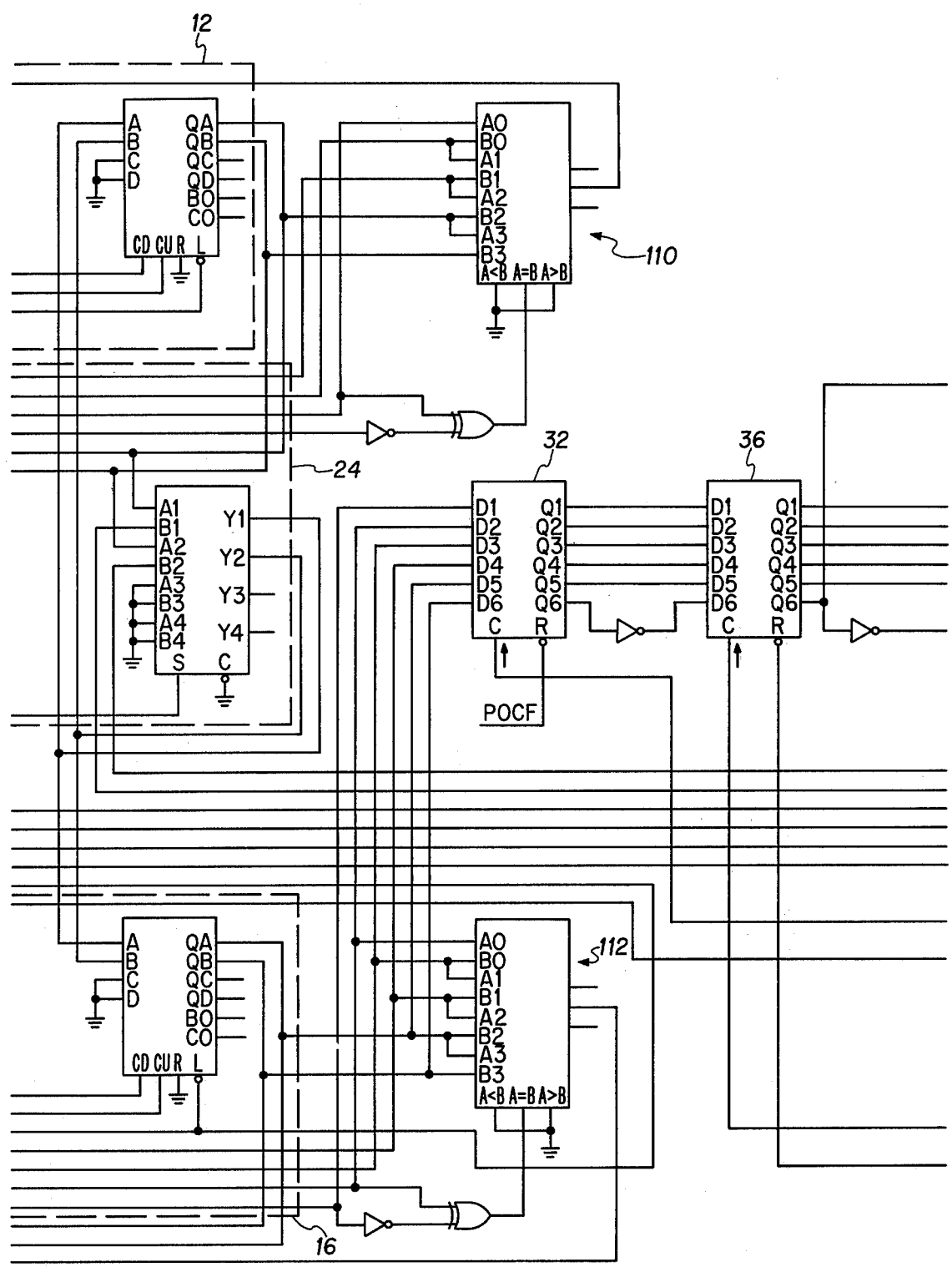
Figure 3C:
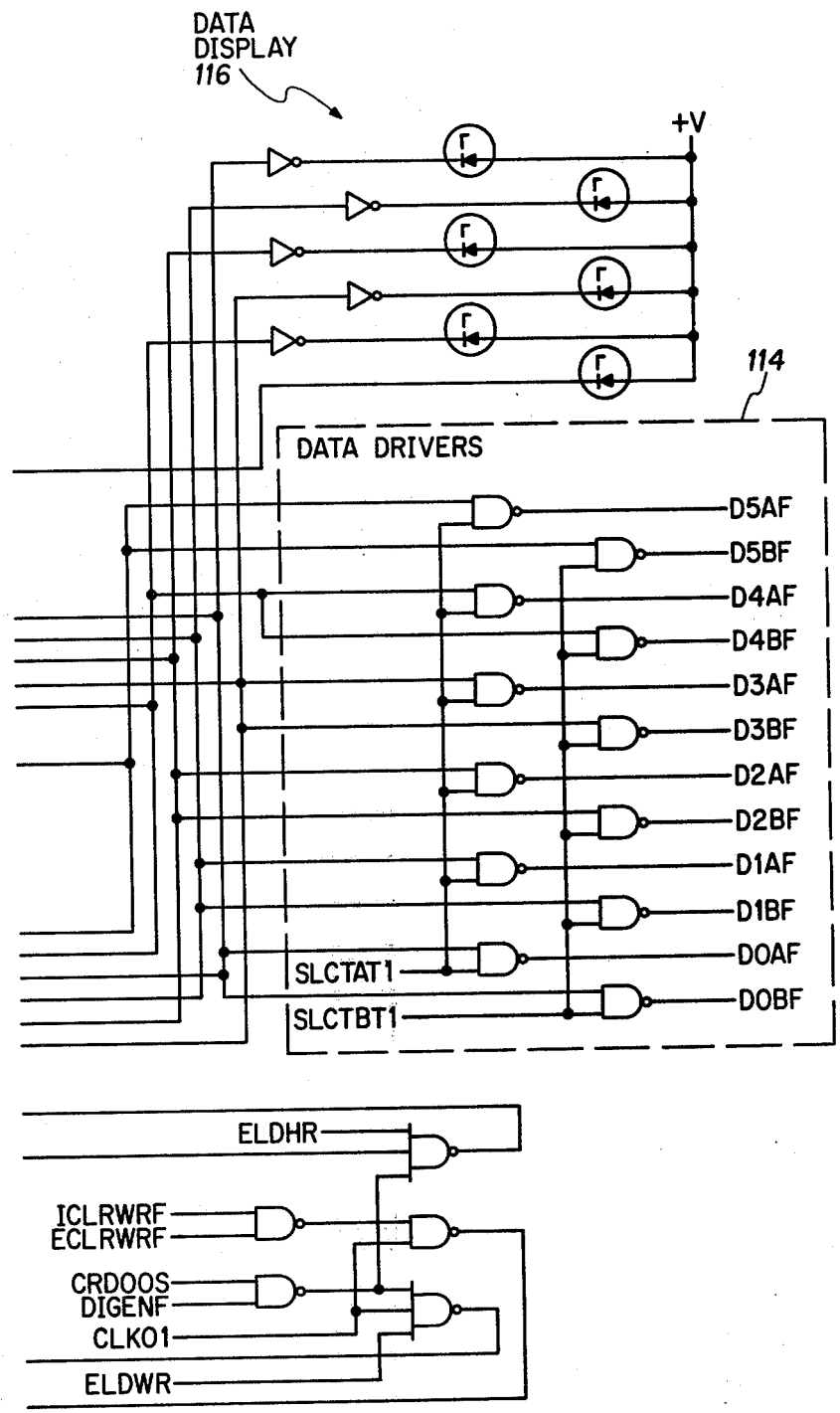

In FIGS. 3a, 3b and 3c the same numbers are given to the various sections as provided in FIG. 1. In other words, in section 12 there are two chips, each of which are 74 LS 193's. These two chips are used to provide the backup counter operation. Two further chips within the area designated as 16 also have 74 LS 193 chips for the primary counter operation. A section designated as 24 contains two 74 LS 257's for use in multiplexing, switching or select action as required in FIG. 1. A 74 LS 174 chip is used to implement holding register 32 as well as working register 36. Two blocks generally designated as 110 and 112 comprise backup counter overflow detection operation and primary counter overflow detection operation respectively. The function of these two detectors is shown in a co-pending application of mine having application, Ser. No. 853,967, filed on Nov. 21, 1977 and assigned to the same assignee as the present invention. The area generally designated as 114 provides the data output such as appears on lead 38 to adder 42 of FIG. 1. The area generally designated as 116 provides an illuminated display of the data appearing on these lines. Many of the remaining portions of FIGS. 3a, 3b and 3c are related to timing as required in timing generator 44. Some of the signals, notably DINEN, CLK18F, CLKAB, WRINC, CLK23, are not from timing generator 44 but are timing signals relating to the count up and count down signals. CLK23 is a gating signal. Finally, two leads 118 and 120 are the enable count up and enable count down signals provided by the timing generator 44 to the primary counter for use in the test cycle.

OPERATION

In normal operation, primary counter 16 is providing a cumulative count of the up and down pulses appearing on lead 10 and 18. If the system is operating properly, the primary counter will normally stay around an intermediate value which in one embodiment of the invention is a number equivalent to a logic 1 with all logic 0's following the logic 1. The function of the counter is to provide an indication of the difference between a recovered clock from incoming data on lead 10 and a local clock (VCXO 60). If there is a large difference, this primary counter is designed to reach either a maximum or minimum predetermined limit which as designed is either all logic 1's or all logic 0's and provide an alarm signal to signify that there is a problem in the received signal from which the recovered clock was derived.

The present invention is designed to assure that the primary counter is working and will reach either of the limits as well as to make sure that it is properly responding to both up and down counts. Thus, periodically the timing generator 44 in combination with tester 40 deactivates either gate 14 or 20. The normal count operation is continued by backup counter 12. During this temporary test condition, timing signals input to primary counter 16 via leads 48 make the primary counter commence counting in, for example, only the up direction. After a sufficient time to assure that the counter will have reached the limit, the number in the counter is transferred through the holding register 32 and the work register 36 back through the data line 38 to the tester 40 where it is compared with an internally generated number. As long as the number obtained from working register 36 is identical to the test number of all logic 1's (positive test), no error is provided on lead 50. The primary counter is then similarly allowed to count down until a sufficient number of pulses have occurred to assure that it is in the minimum limit condition. At this time the count in counter 16 is again transferred through holding register 32 and work register 36 to lead 38 where it is tested in tester 40 against the all logic 0 condition and again if the count favorably compares (is positive), no error is provided on output lead 50. To test the intermediate number, working register 36 is supplied with a signal on timing lead 48 to reset this register to a condition of a logic 1 followed by all logic 0's and this number is transferred via leads 38 through the select circuit 24 to the input of primary counter 16. The number is then further transferred through the holding register 32 and back to work register 36. If the number is still as input to the select block 24, the comparison in tester 40 will again provide positive results and there will be no error output. Assuming that all of the above tests have been satisfactory to data, a signal is provided on lead 48 to select circuit 24 to load the present count of backup counter 12 into primary counter 16. As indicated above, backup counter 12 is used to continue the counting process during the test period. The accuracy of the backup counter is then checked during normal operating procedures by the use of compare circuit 26 which continuously compares the counts from backup counter 12 and the counter 16. If there is ever a difference in the counts during the normal operation, an error output signal is generated on lead 54 and thus provides an activation of the alarm via lead 56.

As may be ascertained from the above, the self-testing of the present invention is not merely a redundancy circuit but is rather a means of actively checking the operation of the primary counter and then testing a portion of the test circuit against the primary counter to make sure that the test circuit is properly operating.

While I have shown a preferred embodiment of the inventive concept, it should be realized that there are many various means of practicing the inventive concept of interrupting a counter for test purposes while continuing operations with a backup counter, and I thus wish to be limited only by the scope of the appended claims.

I claim:
1. Self-test apparatus for testing operation of an up-down counter comprising, in combination:
   first means to be checked for counting input signals;
   second means for supplying up and down count signals under control, to said first means;
   control means, connected to said first means, and said second means, for testing said first means by (1) preventing one of said up and down count signals from being supplied by said second means to said first means, (2) waiting a prescribed interval, and (3) checking to see if the count in said first means coincides with a predetermined count before returning said first means to a normal operation of counting signals from said second means;
   alarm means for providing an error output signal when, upon checking, an improper count is detected by said control means;
   third means, connected to said second means, for counting input signals therefrom and for testing operation of said first means in normal operation; and
   comparison means, connected to said first and third means, for comparing the counts of said first and third means during normal operation and providing an error output signal when the counts do not compare.

2. Self-test apparatus for testing operation of an up-down counter comprising, in combination:
   first means to be checked for counting input signals;
   second means for supplying up and down count signals under control, to said first means;
   control means, connected to said first means, and said second means, for testing said first means by (1) preventing one of said up and down count signals from being supplied by said second means to said first means, (2) waiting a prescribed interval, and (3) checking to see if the count in said first means coincides with a predetermined count before returning said first means to a normal operation of counting signals from said second means;

alarm means for providing an error output signal when, upon checking, an improper count is detected by said control means;

third means, connected to said second means for counting input signals therefrom and for assisting in testing the operation of said first means in normal operation;

transfer means connected to said first means and said third means for transferring the count from said third means to said first means when said control means terminates testing and returns said first means to normal operational conditions; and comparison means, connected to said first and third means, for comparing the counts of said first and third means during normal operation and providing an error output signal when the counts do not compare.

3. The method of testing a primary counter used in accumulating count signals wherein a count must be continuously monitored comprising, the steps of:

applying count signals to a backup counter in addition to those input signals supplied to the primary counter;

comparing the count of the primary counter with the count in the backup counter during nontest operations;

providing an alarm if the comparison result is not in accordance with predetermined conditions during normal operations;

removing the primary counter from normal operations as required for testing of its ability to count to a given value in a given time; and reinstating normal operations after predetermined test results are obtained by transferring the count from said backup counter to said primary counter.

4. Apparatus for testing a primary counter used in accumulating count signals wherein it is required that the count signal be continuously monitored during any testing procedure comprising, in combination:

primary counter means;

backup counter means;

means for applying count signals to said backup counter means and to said primary counter means;

first means, connected to said primary counter means and to said backup counter means, for comparing the count of the primary counter with the count in the backup counter during normal operations;

second means connected to said first means, for providing an alarm if the comparison operation by said first means is not in accordance with predetermined conditions during normal operations;

third means, connected to said primary counter means, for removing the primary counter means from normal operations as required for testing purposes; and fourth means, for reinstating normal operations between said primary counter means and said first means after predetermined test results are obtained by transferring the count from said backup counter to said primary counter.

5. Self-test apparatus for testing operation of an up-down counter comprising, in combination:

first means to be checked for counting input signals;

second means for supplying up count type signals and down count type signals under control, to said first means;

control means, connected to said first means, and said second means and for providing test and return to operation functions comprising, third means for preventing count signals of a given type from being supplied by said second means to said first means, fourth means for delaying normal count action for a prescribed interval while said first means is test counting, fifth means for checking to see if the count in said first means coincides with a predetermined count after the prescribed interval, and sixth means for returning said first means to a normal operation of counting signals from said second means if the count check agrees with predetermined conditions; and alarm means for providing an error output signal when, upon checking an improper count is detected by said control means.

* * * * *